United States Patent
Ikeda et al.

(10) Patent No.: US 9,837,549 B2
(45) Date of Patent: Dec. 5, 2017

(54) OXIDE SEMICONDUCTOR AND SEMICONDUCTOR DEVICE

(71) Applicant: Kabushiki Kaisha Toshiba, Minato-ku (JP)

(72) Inventors: Keiji Ikeda, Kawasaki (JP); Shintaro Nakano, Kawasaki (JP); Yuya Maeda, Yokkaichi (JP); Tomomasa Ueda, Yokohama (JP); Kentaro Miura, Kawasaki (JP); Nobuyoshi Saito, Ota (JP); Tsutomu Tezuka, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/267,705

(22) Filed: Sep. 16, 2016

(65) Prior Publication Data
US 2017/0141230 A1  May 18, 2017

(30) Foreign Application Priority Data

Nov. 17, 2015 (JP) .................................. 2015-225191

(51) Int. Cl.
*H01L 29/786* (2006.01)
*H01L 29/24* (2006.01)

(52) U.S. Cl.
CPC .......... *H01L 29/7869* (2013.01); *H01L 29/24* (2013.01); *H01L 29/78696* (2013.01)

(58) Field of Classification Search
CPC .................................................... H01L 29/7869
USPC ..................................................... 257/43, 57
See application file for complete search history.

(56) References Cited

U.S. PATENT DOCUMENTS

2010/0301328 A1* 12/2010 Yamazaki ........... H01L 29/4908
257/43
2011/0084960 A1  4/2011  Miyake et al.
2015/0001534 A1  1/2015  Chang et al.

FOREIGN PATENT DOCUMENTS

| JP | 2014-140005 A | 7/2014 |
| JP | 2015-103646 A | 6/2015 |
| JP | 2015-122518 A | 7/2015 |
| JP | 2015-144173 A | 8/2015 |

* cited by examiner

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

According to one embodiment, an oxide semiconductor includes indium, gallium, and silicon. A concentration of the silicon in the oxide semiconductor is not less than 7 atomic percent and not more than 11 atomic percent.

8 Claims, 11 Drawing Sheets

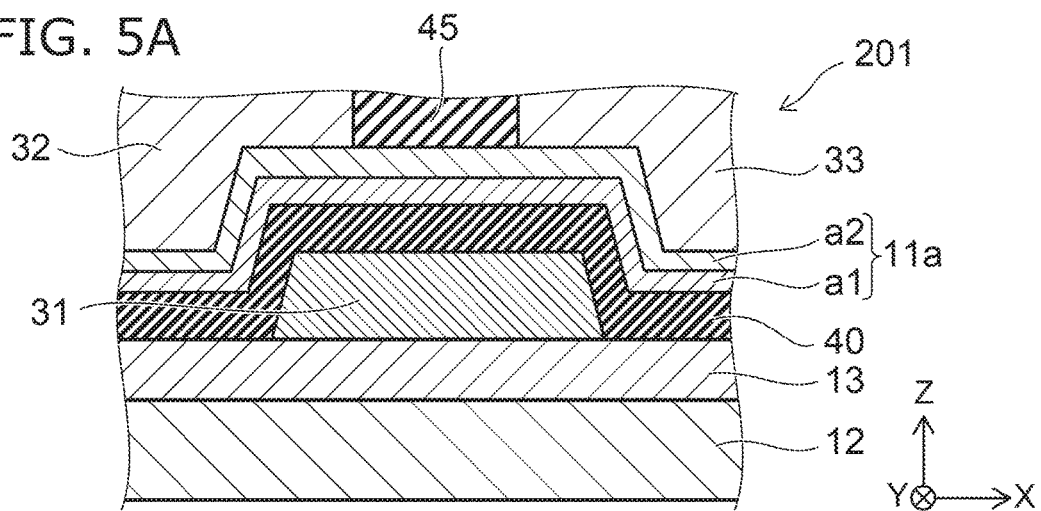
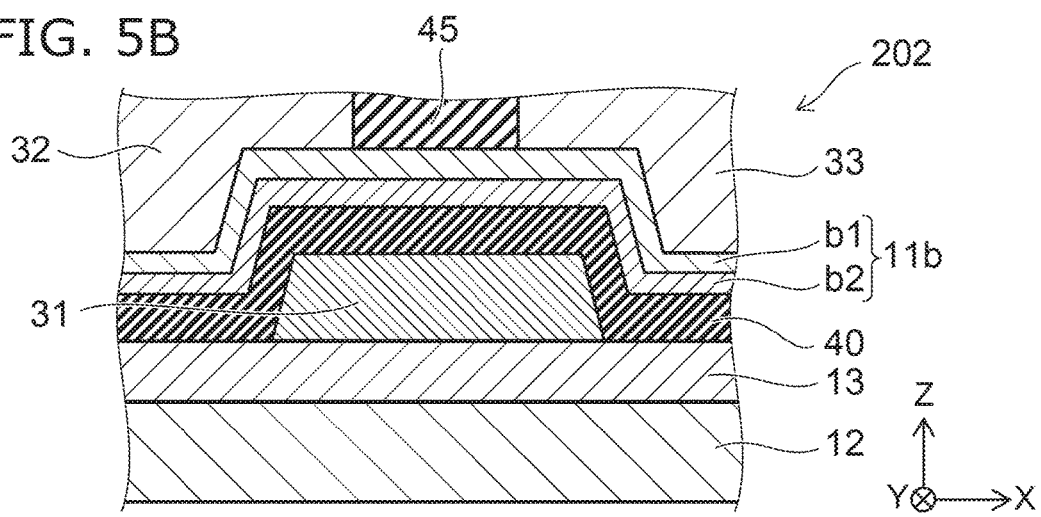
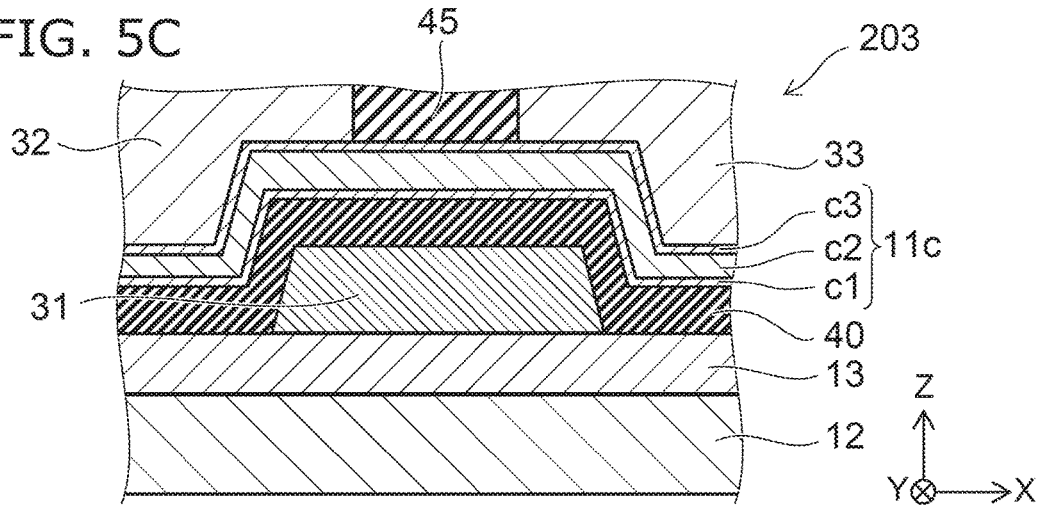

US 9,837,549 B2

OXIDE SEMICONDUCTOR AND SEMICONDUCTOR DEVICE

CROSS-REFERENCE TO RELATED APPLICATIONS

This application is based upon and claims the benefit of priority from Japanese Patent Application No. 2015-225191, filed on Nov. 17, 2015; the entire contents of which are incorporated herein by reference.

FIELD

Embodiments described herein relate generally to an oxide semiconductor and a semiconductor device.

BACKGROUND

Thin Film Transistors (TFT) in which oxide semiconductors are used can be used in LSIs or similar CMOS circuits. For example, a TFT in which an amorphous oxide semiconductor including indium (In), gallium (Ga), and zinc (Zn) is used has gathered attention. In the manufacturing process of a semiconductor device including a CMOS circuit, in, for example, a final process, a heat treatment (hydrogen sintering) in an atmosphere containing hydrogen is performed. In some cases, as a result of the hydrogen sintering, the resistance of the oxide semiconductor is lowered and the characteristics of the transistor are degraded. Therefore, an oxide semiconductor with stable electrical characteristics is desirable.

BRIEF DESCRIPTION OF THE DRAWINGS

FIGS. 5A to 5C are schematic cross-sectional views illustrating semiconductor devices according to a second embodiment;

DETAILED DESCRIPTION

Figure 1:
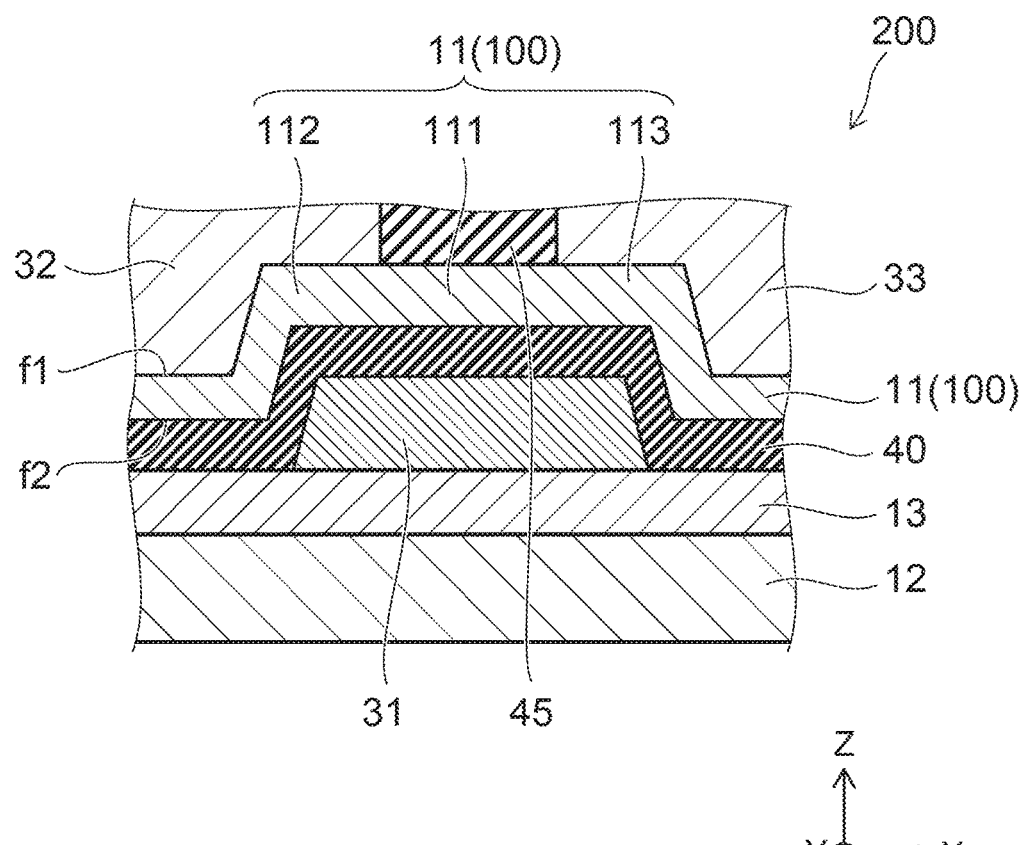
FIG. 1 is a schematic cross-sectional view illustrating the semiconductor device according to the first embodiment.
Figure 2A:
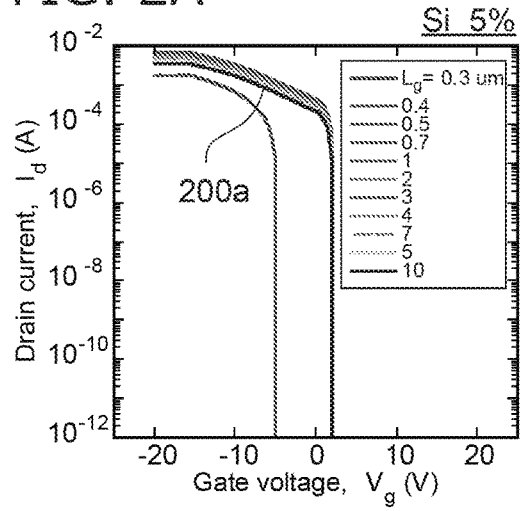
FIGS. 2A to 2E are graphs illustrating characteristics of the semiconductor device according to the first embodiment.
Figure 2B:
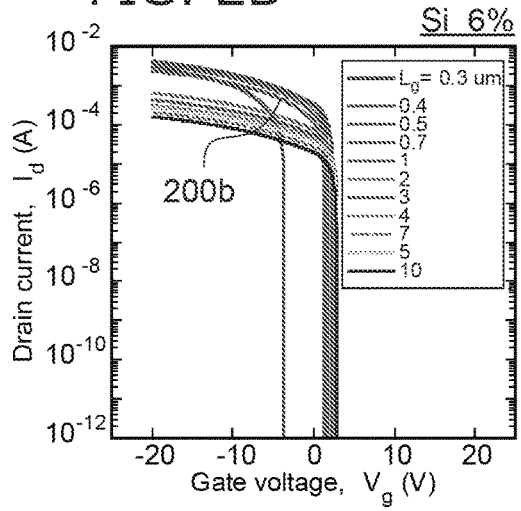
Figure 2C:
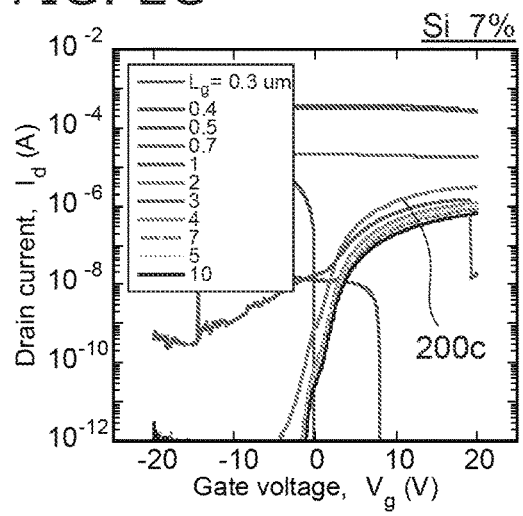
Figure 2D:
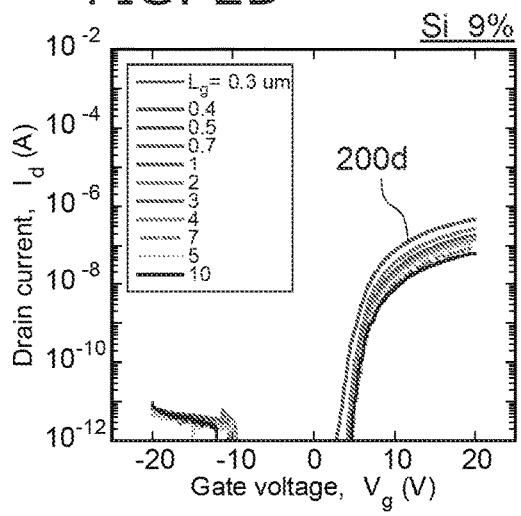
Figure 2E:
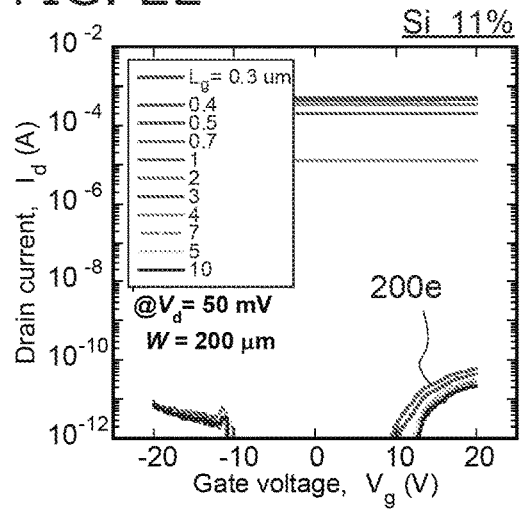

According to one embodiment, an oxide semiconductor includes indium, gallium, and silicon. A concentration of the silicon in the oxide semiconductor is not less than 7 atomic percent and not more than 11 atomic percent.

According to another embodiment, a semiconductor device includes a semiconductor layer and a first conductive portion. The semiconductor layer includes a first region, a second region. The first region includes an oxide including indium, gallium, and silicon. The second region is stacked on the first region in a first direction. The second region includes an oxide including at least one of indium, gallium, or zinc. The first conductive portion is separated from the semiconductor layer in the first direction. A concentration of the silicon in the first region is not less than 7 atomic percent and not more than 11 atomic percent.

According to another embodiment, a semiconductor device includes a semiconductor layer, a first conductive portion. The semiconductor layer includes a first region and a second region. The first region includes an oxide including at least indium, gallium, and silicon. A concentration of the silicon in the first region is higher than a concentration of zinc in the first region. The second region is stacked on the first region in a first direction. The second region includes an oxide including at least indium, gallium, and zinc. A concentration of the zinc in the second region is higher than a concentration of silicon in the second region. The first conductive portion is separated from the semiconductor layer in the first direction.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

A first embodiment relates to an oxide semiconductor and a semiconductor device in which the oxide semiconductor is used.

FIG. 1 is a schematic cross-sectional view illustrating the semiconductor device according to the first embodiment.

As illustrated in FIG. 1, a semiconductor device 200 according to the first embodiment includes a first semiconductor layer 11, a first conductive portion 31, a second conductive portion 32, a third conductive portion 33, and a first insulating layer 40.

The semiconductor device 200 is, for example, a thin film transistor.

For example, the first conductive portion 31 is a gate electrode, the second conductive portion 32 is a source electrode, and the third conductive portion 33 is a drain electrode. The first semiconductor layer 11 is, for example, a semiconductor layer forming a channel of the transistor, and the first insulating layer 40 is a gate insulating film.

In this example, the semiconductor device 200 further includes a second semiconductor layer 12 (a substrate), a second insulating layer 45, and a third insulating layer 13 (an undercoat layer).

In this example, a direction from the first conductive portion 31 toward the first semiconductor layer 11 is defined as a "Z-axis direction". One direction perpendicular to the Z-axis direction is defined as an "X-axis direction". A direction perpendicular to both the Z-axis direction and the X-axis direction is defined as a "Y-axis direction".

The second semiconductor layer 12, the third insulating layer 13, the first conductive layer 31, the first insulating layer 40, and the first semiconductor layer 11 are stacked in this order in the Z-axis direction.

A substrate including silicon (Si), for example, is used for the second semiconductor layer 12. $SiO_2$, for example, is used for the material of the third insulating layer 13 (the undercoat layer).

Any one of, for example, W, WN, Mo, Ta, TaN, Ti, TiN, Al, AlNd, Cu, ITO, and IZO may be used for the first conductive portion 31. An alloy of these or a stacked structure of these materials may also be used for the first conductive portion 31. In this example, MoTa is used for the first conductive portion 31.

The first semiconductor layer 11 is separated from the first conductive portion 31 in the Z-axis direction. An oxide semiconductor 100 according to the embodiment is used as the material of the first semiconductor layer 11.

The oxide semiconductor 100 is an oxide including indium (In), gallium (Ga), and Si. For example, InGaSiO is used for the oxide semiconductor 100. A concentration of the silicon in the oxide semiconductor 100 (Si composition ratio of the InGaSiO) is preferably not less than 7 at % (atomic percent) and not more than 11 at %. The concentration of the Si in the oxide semiconductor 100 is higher than a concentration of zinc (Zn) in the oxide semiconductor 100. The oxide semiconductor 100 may, for example, be substantially free of Zn.

The first semiconductor layer 11 includes a first portion 111 (a channel region), a second portion 112 (a source region), and a third portion 113 (a drain region). The second portion 112 is separated from the third portion 113 in the X-axis direction. The first portion 111 is positioned between the second portion 112 and the third portion 113.

A thickness of the first semiconductor layer 11 (a length along the Z-axis direction in the channel region) is, for example, not less than 5 nanometers (nm) and not more than 100 nm and, in the following example, is 30 nm.

The second conductive portion 32 (the source electrode) is electrically connected to the second portion 112. The third conductive portion 33 (the drain electrode) is electrically connected to the third portion 113. Any one of, for example, Ti, Mo, Al, Cu, Ta, W, TIN, TaN, MoN, WN, ITO, IZO, InGaZn, and InGaZnO:N may be used for the second conductive portion 32 and the third conductive portion 33. An alloy of these or a stacked structure of films of these materials may be used for the second conductive portion 32 and the third conductive portion 33.

The first insulating layer 40 (the gate insulating film) is provided between the first semiconductor layer 11 (the first portion 111) and the first conductive portion 31. The second portion 112 is provided between the first insulating layer 40 and the second conductive portion 32. The third portion 113 is provided between the first insulating layer and the third conductive portion 33. Any one of silicon dioxide, silicon nitride, silicon oxynitride, $SiO_2$ deposited by tetra ethoxysilane (TEOS) CVD, aluminum oxide, tantalum oxide, hafnium oxide, zirconium oxide, or titanium oxide, a compound thereof, and a stacked film thereof, for example, may be used for the first insulating layer 40.

The semiconductor device 200 illustrated in FIG. 1 is, for example, a thin film transistor with a bottom gate/top contact structure. Specifically, the second conductive portion 32 and the third conductive portion 33 are in contact with the first semiconductor layer 11 at an upper face (a first face f1) of the first semiconductor layer 11. The first insulating layer 40 is in contact with the first semiconductor layer 11 at a lower face (a second face f2 separated from the first face f1 in the Z-axis direction) of the first semiconductor layer 11. A distance between the upper face and the substrate is greater than a distance between the lower face and the substrate. However, it should be understood that the semiconductor device 200 according to the embodiment is not limited to a bottom gate/top contact structure.

The second insulating layer 45 is provided between the second conductive portion 32 and the third conductive portion 33, and insulates the second conductive portion 32 and the third conductive portion 33. Any one of silicon oxide, silicon nitride, silicon oxynitride, TEOS, aluminum oxide, tantalum oxide, hafnium oxide, zirconium oxide, and titanium oxide may, for example, be used for the second insulating layer 45. A mixture of these or a stacked structure of films of these materials may be used for the second insulating layer 45.

The second insulating layer 45 is, for example, an etching stopper layer. A length along the X-axis direction of the second insulating layer 45 is equivalent to a channel length of the transistor. In other words, the channel region of the first semiconductor layer 11 (the first portion 111) is a region in contact with the second insulating layer 45, the source region (the second portion 112) is a region in contact with the second conductive portion 32, and the drain region (the third portion 113) is a region in contact with the third conductive portion 33.

The semiconductor device such as that illustrated in FIG. 1 can be used by being stacked on an LSI or similar CMOS circuit. In an LSI or similar semiconductor manufacturing process, in, for example, a final process thereof, hydrogen sintering is performed. As a result, interface state density in the semiconductor layer interface can decline. The hydrogen sintering is performed at, for example, a temperature of approximately not lower than 300° C. and not higher than 450° C.

A semiconductor device of a reference example exists in which a single layer of InGaZnO (IGZO) is used as the semiconductor layer forming the channel of a thin film transistor. In this semiconductor device of the reference example, when the hydrogen sintering is performed at a high temperature of, for example, not lower than 380° C., the resistance of the InGaZnO easily declines. This is considered to be caused by oxygen deficiency in the InGaZnO increasing due to the reduction reaction caused by the hydrogen sintering or, by a donor level being formed as a result of hydrogen being adsorbed to the oxygen deficiency. The oxygen deficiency functions as a donor in the oxide semiconductor and, as such, semiconductor layers are sometimes made conductive by hydrogen sintering at a high temperature. As a result, the characteristics as a transistor may degrade and failures may occur in the switching operations. Bond dissociation energy between the Zn and the oxygen is comparatively low (Zn—O: <250 kJ/mol) and, therefore, in the semiconductor device of the reference example, there are cases where the hydrogen sintering results in the transistor operations being impossible to maintain.

In contrast, the oxide semiconductor 100 according to the first embodiment includes the InGaSiO. Bond dissociation energy between the Si and the oxygen is comparatively high (Si—O: 799 kJ/mol). As such, oxygen deficiencies will not easily occur, even if the oxide semiconductor 100 is subjected to hydrogen sintering at a high temperature. Thus, with the oxide semiconductor 100, resistance does not decline easily and stable characteristics can be obtained. Accordingly, in the semiconductor device 200 in which the oxide semiconductor 100 is used, sintering resistance can be improved and stable electrical characteristics can be obtained.

FIGS. 2A to 2E are graphs illustrating characteristics of the semiconductor device according to the first embodiment.

Each of FIGS. 2A to 2E illustrates the transistor characteristics of a semiconductor device identical to the semiconductor device 200 described while referencing FIG. 1. Gate voltage Vg (V) is shown on the horizontal axes. Drain current Id (A) is shown on the vertical axes. Characteristics of a plurality of the semiconductor devices are shown in which a gate length Lg (a distance between the second portion 112 and the third portion 113) is not less than 0.3 μm and not more than 10 μm. In each of the semiconductor devices, a drain voltage is 50 millivolts (mV) and a channel width W (a length along the Y-axis direction of the first portion 111) is 200 μm. Each of the semiconductor devices is subjected to hydrogen sintering in a nitrogen atmosphere containing 2% hydrogen at 430° C. for one hour.

Each of the semiconductor devices illustrated in FIGS. 2A to 2E differs from the other semiconductor devices in terms of silicon concentration in the oxide semiconductor 100. FIGS. 2A to 2E illustrate cases where the silicon concentration in the oxide semiconductor 100 is 5 at %, 6 at %, 7 at %, 9 at %, and 11 at %, respectively.

As illustrated in FIGS. 2A to 2E, excellent transistor operations can be obtained in cases where the silicon composition ratio is 7 at %, 9 at %, and 11 at %. With the thin film transistor in which the InGaSiO is used, excellent characteristics can be maintained, even with respect to hydrogen sintering at a high temperature of 430° C.

Operation failures may occur in regions where the silicon concentration is low. For example, when the silicon concentration is 7 at %, excellent transistor operations may not be obtainable in a semiconductor device with a gate length Lg of 1 μm or less. In regions where the silicon concentration is high (the case in FIG. 2E where the silicon concentration is 11 at %), excellent characteristics can be obtained even when the gate length Lg=1 μm.

For example, reduction reactions may be prone to occur, with the source and the drain electrode as catalysts, at a junction interface between the source and the drain electrode, namely the source and drain regions of the channel. Thus, when the gate length Lg is short, there are cases where the effects of the spread of the conduction region from the source and the drain region become profound.

Figure 3:
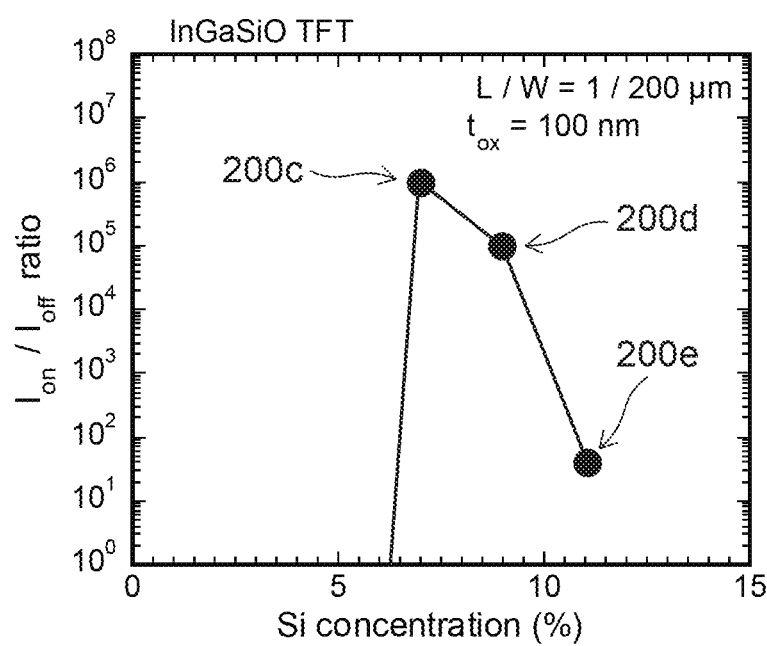
FIG. 3 is a graph illustrating the characteristics of the semiconductor device according to the first embodiment.

FIG. 3 is a graph illustrating the characteristics of the semiconductor device according to the first embodiment.

FIG. 3 illustrates a relationship between the silicon concentration in the oxide semiconductor 100 and an on-off ratio of the drain current.

Here, for example, the characteristics of the semiconductor devices 200a to 200e illustrated in FIGS. 2A to 2E are compared. The semiconductor devices 200a to 200e are semiconductor devices among those illustrated in FIGS. 2A to 2E, in which the gate length Lg=1 μm.

A composition of the InGaSiO in semiconductor device 200a is $In_{0.29}Ga_{0.05}Si_{0.05}O_{0.61}$;
a composition of the InGaSiO in semiconductor device 200b is $In_{0.26}Ga_{0.07}Si_{0.06}O_{0.61}$;
a composition of the InGaSiO in semiconductor device 200c is $In_{0.22}Ga_{0.09}Si_{0.07}O_{0.62}$;
a composition of the InGaSiO in semiconductor device 200d is $In_{0.19}Ga_{0.11}Si_{0.09}O_{0.62}$; and
a composition of the InGaSiO in semiconductor device 200e is $In_{0.13}Ga_{0.14}Si_{0.11}O_{0.62}$.

A ratio ($I_{on}/I_{off}$) of $I_{on}$ to $I_{off}$ is shown on the vertical axis of FIG. 3. $I_{on}$ is the drain current when the drain voltage Vd=50 mV and the gate voltage Vg=20 V. $I_{off}$ is defined by the drain current ($10^{-12}$ A) of a measurement lower limit at drain voltage Vd=50 mV.

In cases where the silicon concentration is 5 at % or 6 at % (the semiconductor device 200a or 200b), the $I_{on}/I_{off}$ is less than 1. It is known that the $I_{on}/I_{off}$ critically changes depending on the silicon concentration, and that excellent characteristics can be obtained even after hydrogen sintering in cases where the silicon concentration is from 7 to 11 at %. For example, in cases where the silicon concentration is 7 at %, an $I_{on}/I_{off}$ greater than $10^6$ can be obtained. From the results described above, it is understood that, in an oxide semiconductor including indium, gallium, and silicon, the $I_{on}/I_{off}$ is heavily dependent on the concentration of the silicon.

According to the research by the inventors, for example, by increasing the silicon concentration in the InGaSiO, sintering resistance can be improved, but if the silicon concentration is excessively increased, the mobility of the carrier in the InGaSiO will decline.

The concentration of the silicon in the InGaSiO (the oxide semiconductor 100) is preferably not less than 7 at % and not more than 11 at %. Thereby, for example, an oxide semiconductor having high carrier mobility and high sintering resistance can be obtained. For example, in the semiconductor 200e, the silicon concentration is 11 at % and, here, the $I_{on}/I_{off}$ is about 40. From FIG. 3, when the silicon concentration is 7 at %, the $I_{on}/I_{off}$ is about $10^6$. In the embodiment, a concentration of the gallium in the oxide semiconductor 100 may be set to, for example, not less than 9 at % and not more than 14 at %.

Next, the semiconductor devices 200a and 200b, and a method for manufacturing the oxide semiconductor 100 used therein will be described. Note that the following is an example of a method for manufacturing the oxide semiconductor according to the embodiments, but the embodiments are not limited thereto.

For example, a sputtering method is used in the manufacture of the oxide semiconductor 100 according to the embodiments. For example, a co-sputtering method may be used in which discharging on two targets is performed. InGaSiO (In:Ga:Si:O=1:1:1:5) is used as a first target and $In_2O_3$ is used as a second target. The $In_2O_3$ is an oxide material having high carrier mobility (up to 40 cm$^2$/Vs).

Input power (discharge power) applied to the first target (the InGaSiO) is set to 400 watts (W), and input power applied to the second target (the $In_2O_3$) is varied. Thus, the composition ratio of the oxide semiconductor may be varied. The film forming atmosphere is, for example, an Ar flow of 50 sccm and an $O_2$ flow of 10 sccm.

Figure 4A:
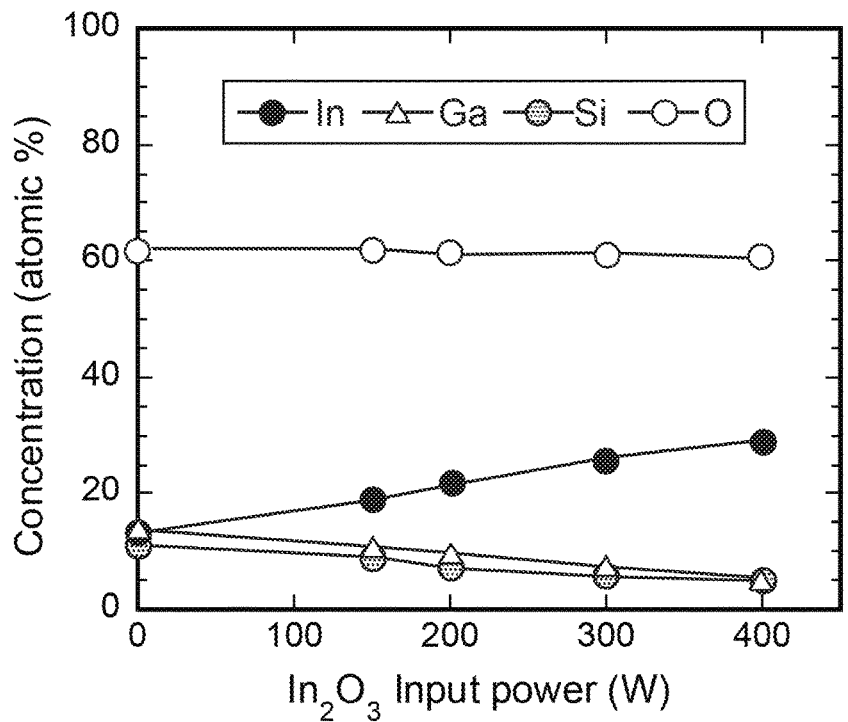
FIGS. 4A and 4B are graphs illustrating a relationship between the input power and the characteristics of the oxide semiconductor.
Figure 4B:
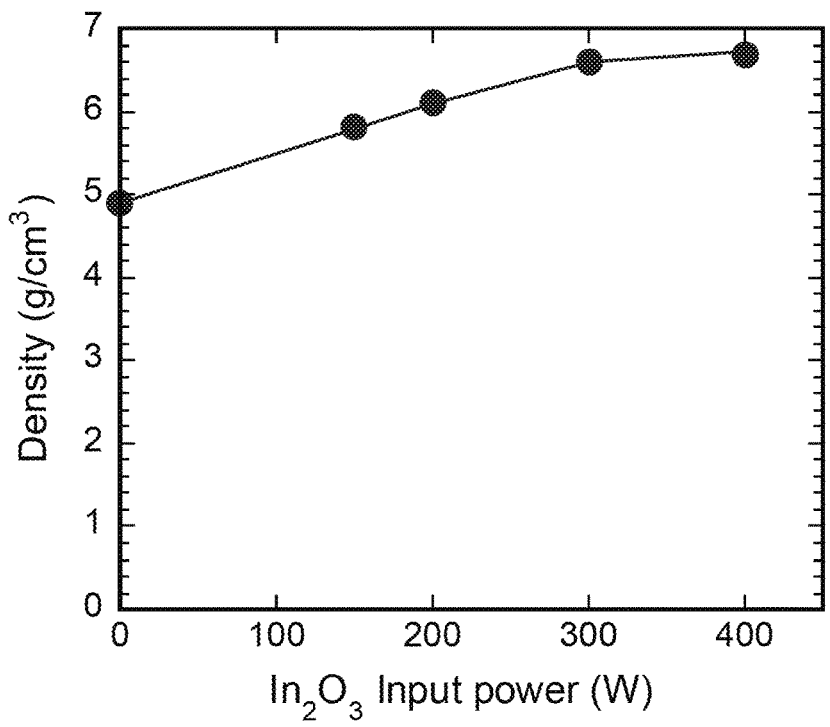

FIGS. 4A and 4B are graphs illustrating a relationship between the input power and the characteristics of the oxide semiconductor.

The input power applied to the second target (the $In_2O_3$) is shown on the horizontal axes of FIGS. 4A and 4B. Respective concentrations of the atoms in the formed oxide semiconductor are shown on the vertical axis of FIG. 4A. These concentrations are measured by High Resolution Rutherford Backscattering Spectrometry (HR-RBS).

In this method, the In composition increases proportionately with the input power applied to the second target (the $In_2O_3$) and the concentrations of the Si and the Ga decrease relative thereto. In cases where forming an oxide semiconductor film with a thickness of 30 nm, when the input power applied to the $In_2O_3$ target is 400 W, $In_{0.29}Ga_{0.05}Si_{0.05}O_{0.61}$ is obtained; when 300 W, $In_{0.26}Ga_{0.07}Si_{0.06}O_{0.61}$ is obtained; when 200 W, $In_{0.22}Ga_{0.09}Si_{0.07}O_{0.62}$ is obtained; when 150 W, $In_{0.19}Ga_{0.11}Si_{0.09}O_{0.62}$ is obtained; and when 0 W, $In_{0.13}Ga_{0.14}Si_{0.11}O_{0.62}$ is obtained. In this range, the silicon concentration decreases from 11 at % to 5 at %, and the Ga concentration decreases from 14.1 at % to 5.3 at %.

A density of the formed oxide semiconductor is shown on the vertical axis of FIG. 4B. The density increases as a result of increasing the input power applied to the second target (the $In_2O_3$). The density is 6.7 g/cm$^3$ in $In_{0.29}Ga_{0.05}Si_{0.05}O_{0.61}$ where the silicon concentration is lowest among the conditions illustrated in FIG. 4B. The density of the oxide semiconductor 100 is preferably not less than 5.0 g/cm$^3$ and not more than 8.0 g/cm$^3$, for example. It is possible to form a low Si concentration InGaSiO channel via the co-sputtering method described above.

In the formation of the semiconductor devices (200a to 200e), a Mo film with a thickness of 25 nm is formed as the gate electrode (the first conductive portion 31). Then, a $SiO_2$ film with a thickness of 20 nm is formed as the gate insulating film (the first insulating layer 40). This $SiO_2$ film is formed at 350° C. via a PECVD method. Then, an oxide semiconductor is formed as the first semiconductor layer 11 on the $SiO_2$ film via the co-sputtering method described above. Thereafter, an active region is patterned and, then, a $SiO_2$ film that serves as the etching stop layer (the second insulating layer) is formed. This $SiO_2$ film is formed at 250° C. via the PECVD method, and a thickness thereof is 150 nm. Then, contact holes are opened and a Mo film with a thickness of 80 nm is formed via sputtering as the source/drain electrodes. Next, interconnections are formed via reactive ion etching (RIE). Thus, the oxide semiconductor and the semiconductor device according to the first embodiment can be manufactured.

Second Embodiment

FIGS. 5A to 5C are schematic cross-sectional views illustrating semiconductor devices according to a second embodiment.

Semiconductor devices 201 to 203 illustrated in FIGS. 5A to 5C are thin film transistors having a hetero channel in which, for example, InGaSiO having high hydrogen sintering resistance and an oxide semiconductor for which high mobility characteristics can be expected (e.g. InGaZnO) are combined.

Each of the semiconductor devices 201 to 203 according to the embodiment includes a second semiconductor layer 12, a first conductive portion 31, a second conductive portion 32, a third conductive portion 33, a first insulating layer 40, a second insulating layer 45, and a third insulating layer 13. The same descriptions given for the semiconductor device 200 according to the first embodiment may be applied to these constituents.

The semiconductor device 201 illustrated in FIG. 5A includes a first semiconductor layer 11a. Other than this, the semiconductor device 201 is the same as the semiconductor device 200. The first semiconductor layer 11a includes a first region a1 and a second region a2. The second region a2 is stacked on the first region a1 in the Z-axis direction. The first region a1 is provided between the first conductive portion 31 and the second region a2.

The first region a1 includes an oxide including In, Ga, and Si. The second region a2 includes an oxide including at least one of In, Ga, and Zn. In the first region a1, a Si concentration at % is higher than a Zn concentration at % and, for example, InGaSiO is used as the material of the first region a1. In the second region a2, a Zn concentration at % is higher than a Si concentration at % and, for example, InGaZnO is used as the material of the second region a2. The oxide semiconductor 100 described above is preferably used as the InGaSiO included in the first region a1, and the Si concentration in the first region a1 is preferably not less than 7 at % and not more than 11 at %.

The Zn concentration at % in the first region a1 is lower than the Zn concentration at % in the second region a2. The first region a1 may be substantially free of Zn. The Si concentration at % in the second region a2 is lower than the Si concentration at % in the first region a1. The second region a2 may be substantially free of Si. A thickness of the first region a1 may be, for example, not less than 5 nm and not more than 50 nm, and a thickness of the second region a2 may be, for example, not less than 0.5 nm and not more than 20 nm. Other than this, the first semiconductor layer 11a is the same as the first semiconductor layer 11 described in the first embodiment.

The semiconductor device 202 illustrated in FIG. 5B includes a first semiconductor layer 11b. Other than this, the semiconductor device 202 is the same as the semiconductor device 200. The first semiconductor layer 11b includes a first region b1 and a second region b2. The second region b2 is stacked on the first region b1 in the Z-axis direction. The second region b2 is provided between the first conductive portion 31 and the first region b1.

The material of the first region b1 is the same as that described for the material of the first region a1 illustrated in FIG. 5A. The material of the second region b2 is the same as that described for the material of the second region a2 illustrated in FIG. 5A. That is, for example, InGaSiO (e.g. the oxide semiconductor 100) may be used for the first region b1 and InGaZnO may be used for the second region b2. A thickness of the first region b1 may be, for example, not less than 0.5 nm and not more than 20 nm, and a thickness of the second region b2 may be, for example, not less than 5 nm and not more than 50 nm. Other than this, the first semiconductor layer 11b is the same as the first semiconductor layer 11 described in the first embodiment.

The semiconductor device 203 illustrated in FIG. 5C includes a first semiconductor layer 11c. Other than this, the semiconductor device 203 is the same as the semiconductor device 200. The first semiconductor layer 11c includes a first region c1, a second region c2, and a third region c3. The first region c1, the second region c2, and the third region c3 are stacked in this order in the Z-axis direction. That is, the first region c1 is provided between the first conductive portion 31 and the second region c2, and the second region c2 is positioned between the first region c1 and the third region c3.

The material of the first region c1 and the material of the third region c3 are each the same as that described for the material of the first region a1 illustrated in FIG. 5A. The material of the second region c2 is the same as that described for the material of the second region a2 illustrated in FIG. 5A. That is, for example, InGaSiO (e.g. the oxide semiconductor 100) may be used for the first region c1, InGaZnO may be used for the second region c2, and InGaSiO (e.g. the oxide semiconductor 100) may be used for the third region c3. The composition of the InGaSiO used for the first region c1 and the composition of the InGaSiO used for the third region c3 may be the same or may be different. The semiconductor device 203 has, for example, a double hetero channel structure. A thickness of the first region c1 may be, for example, not less than 0.5 nm and not more than 50 nm, a thickness of the second region c2 may be, for example, not less than 5 nm and not more than 50 nm, and a thickness of the third region c3 may be, for example, not less than 0.5 nm and not more than 20.

The first semiconductor layers 11a to 11c described above may be formed via the sputtering method, the co-sputtering method described above, or a combination thereof. Thus, in the second embodiment, InGaSiO and a separate oxide semiconductor are stacked. Thereby, high carrier mobility and high hydrogen sintering resistance can be obtained.

For example, in the first semiconductor layer 11a of FIG. 5A, InGaSiO having high hydrogen sintering resistance is used for the first region a1 positioned on the gate electrode side, and the second region a2 including the oxide semiconductor is stacked thereon. Thus, for example, desorption of oxygen due to the hydrogen sintering can be suppressed. Accordingly, higher hydrogen sintering resistance can be obtained. The silicon concentration in the InGaSiO included in the first region a1 is, for example, not less than 7 at % and not more than 11 at %. Thereby, high carrier mobility and high sintering resistance can be obtained.

For example, in the first semiconductor layer 11b of FIG. 5B, InGaZnO having high carrier mobility is used for the second region b2 positioned on the gate electrode side, and the first region b1 including InGaSiO is stacked thereon. Additionally, for example, in the first semiconductor layer 11c of FIG. 5C, the InGaZnO (the second region c2) having high carrier mobility is positioned between the InGaSiO having high hydrogen sintering resistance (the first region c1 and the third region c3). The silicon concentration in the InGaSiO, is preferably not less than 7 at % and not more than 11 at %. Thereby, high carrier mobility and high sintering resistance can be obtained.

FIGS. 6A to 6C and FIGS. 7A to 7C are graphs illustrating characteristics of semiconductor devices according to the second embodiment.

These graphs illustrated the transistor characteristics of the semiconductor devices 201 to 203.

In the measurements of FIGS. 6A to 6C, FIGS. 7A to 7C, and FIG. 8, specific structures of the semiconductor devices 201 to 203 were as follows.

A silicon substrate was used for the substrate (the second semiconductor layer 12), and $SiO_2$ obtained via thermal oxidation was used for the undercoat layer (the third insulating layer 13). MoTa was used for the material of the first conductive portion 31. Silicon oxide was used for the first insulating layer 40 and the second insulating layer 45, a thickness of the first insulating layer 40 was 20 nm and a thickness of the second insulating layer 45 was 150 nm.

In the first semiconductor layer 11a of the semiconductor device 201, a thickness of the first region a1 was 10 nm and a thickness of the second region a2 was 10 nm. In the first semiconductor layer 11b of the semiconductor device 202, a thickness of the first region b1 was 10 nm and a thickness of the second region b2 was 10 nm. In the first semiconductor layer 11c of the semiconductor device 203, a thickness of the first region c1 was 5 nm, a thickness of the second region c2 was 10 nm, and a thickness of the third region c3 was 5 nm. InGaSiO (input power applied to $In_2O_3$ target=300 W) formed via the co-sputtering method described above was used for the first region a1, the first region b1, the first region c1, and the third region c3. InGaZnO was used for the second region a2, the second region b2, and the second region c2.

FIGS. 6A to 6C and FIGS. 7A to 7C illustrate characteristics of the drain current Id (A) with respect to the gate voltage Vg (V). In the semiconductor devices, the gate length Lg=2 µm, and the channel width W=2 µm. In the measurements, the drain voltage is 1 V.

Figure 6A:
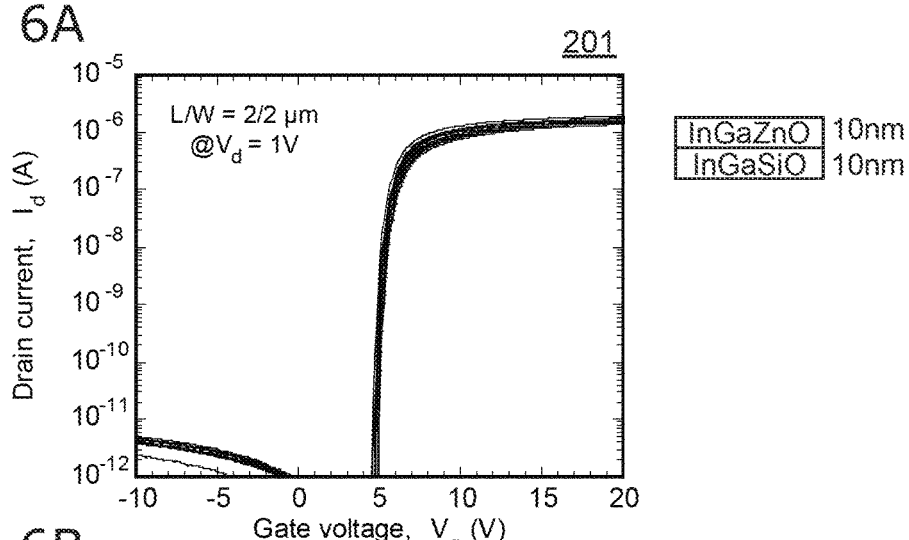
FIGS. 6A to 6C are graphs illustrating characteristics of semiconductor devices according to the second embodiment.
Figure 6B:
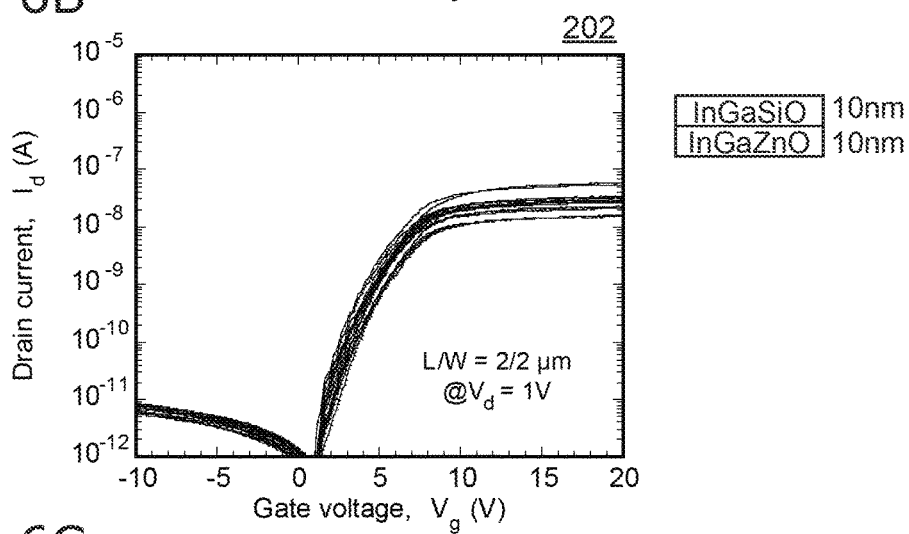
Figure 6C:
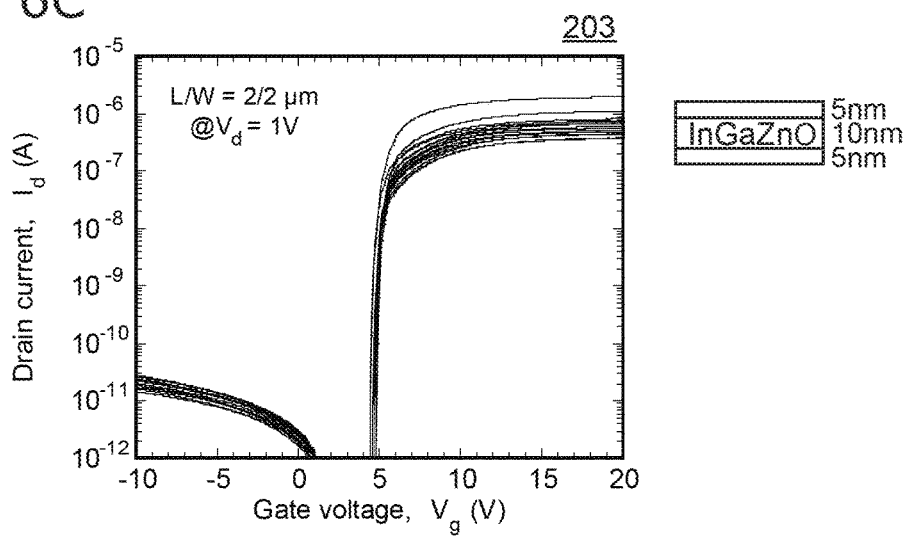
Figure 7A:
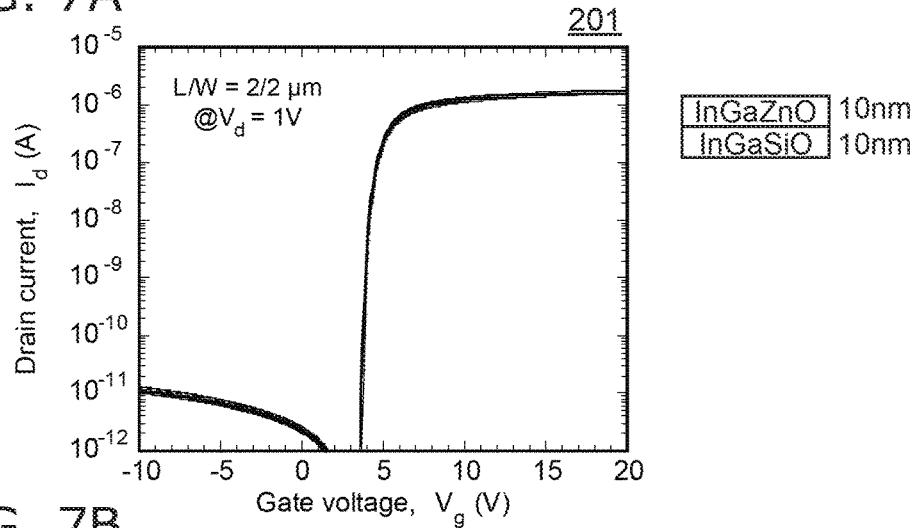
FIGS. 7A to 7C are graphs illustrating characteristics of semiconductor devices according to the second embodiment.
Figure 7B:
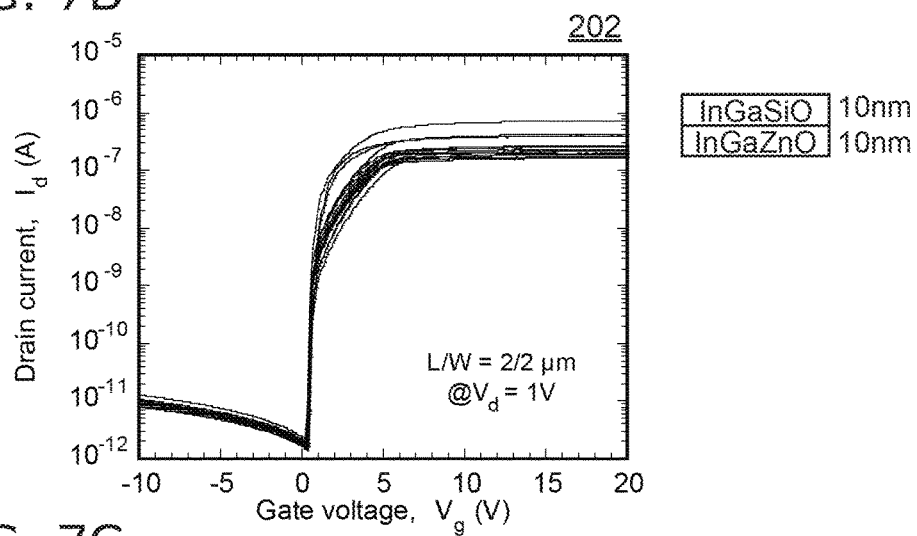
Figure 7C:
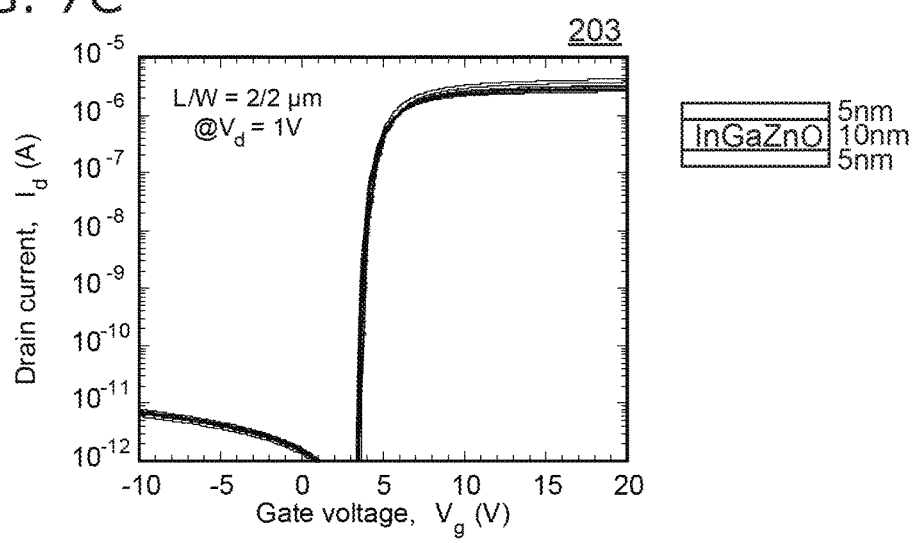

FIGS. 6A to 6C illustrate, respectively, characteristics of the semiconductor devices 201 to 203 that have been subjected to hydrogen sintering ($N_2+H_2$ (2%) anneal) at 300° C. for one hour. FIGS. 7A to 7C illustrate, respectively, characteristics of the semiconductor devices 201 to 203 that have been subjected to hydrogen sintering ($N_2+H_2$ (2%) anneal) at 360° C. for one hour. Even after the hydrogen sintering at 360° C. for one hour, all of the semiconductor devices 201 to 203 can be confirmed as having the desired transistor characteristics.

Figure 8:
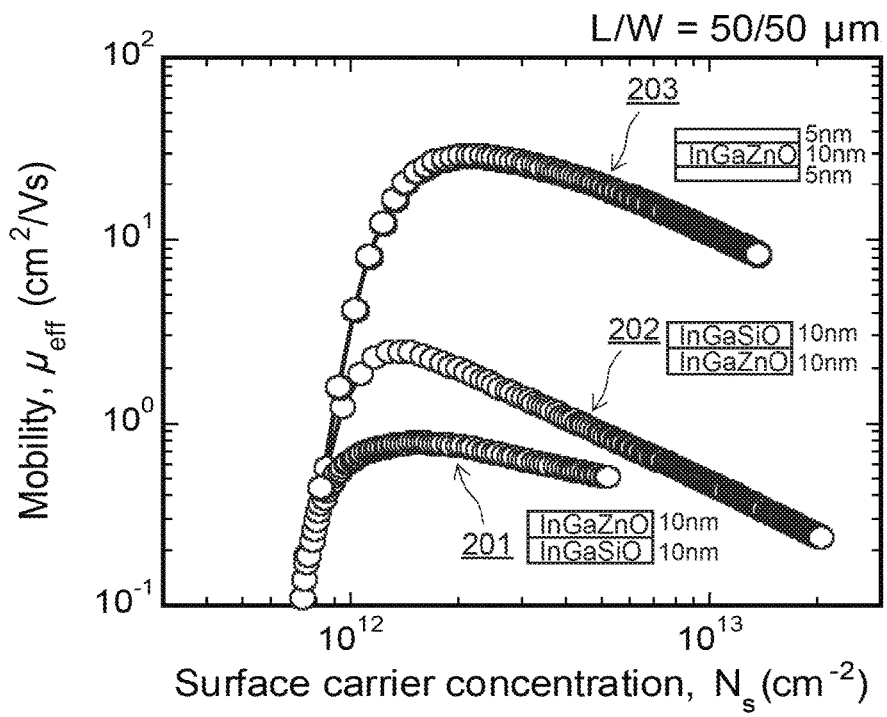
FIG. 8 is a graph illustrating characteristics of semiconductor devices according to the second embodiment.

FIG. 8 illustrates a relationship between the mobility $\mu_{eff}$ ($cm^2/Vs$) of the carrier in the channel and the carrier density Ns ($cm^{-2}$) in the semiconductor devices 201 to 203, after the hydrogen sintering at 360° C. for one hour. The mobility can be measured via a split-CV method.

For example, a peak mobility in the semiconductor device 201 is not more than 1 $cm^2/Vs$, and a peak mobility in the semiconductor device 202 is not more than 3 $cm^2/Vs$. A peak mobility in the semiconductor device 203 is approximately 30 $cm^2/Vs$. Thus, in a structure such as the first semiconductor layer 11c of the semiconductor device 203, high mobility greatly exceeding the mobility of InGaZnO can be attained.

As described above, according to the embodiment, a semiconductor device with high carrier mobility and stable characteristics due to high hydrogen sintering resistance can be provided.

Third Embodiment

Figure 9:
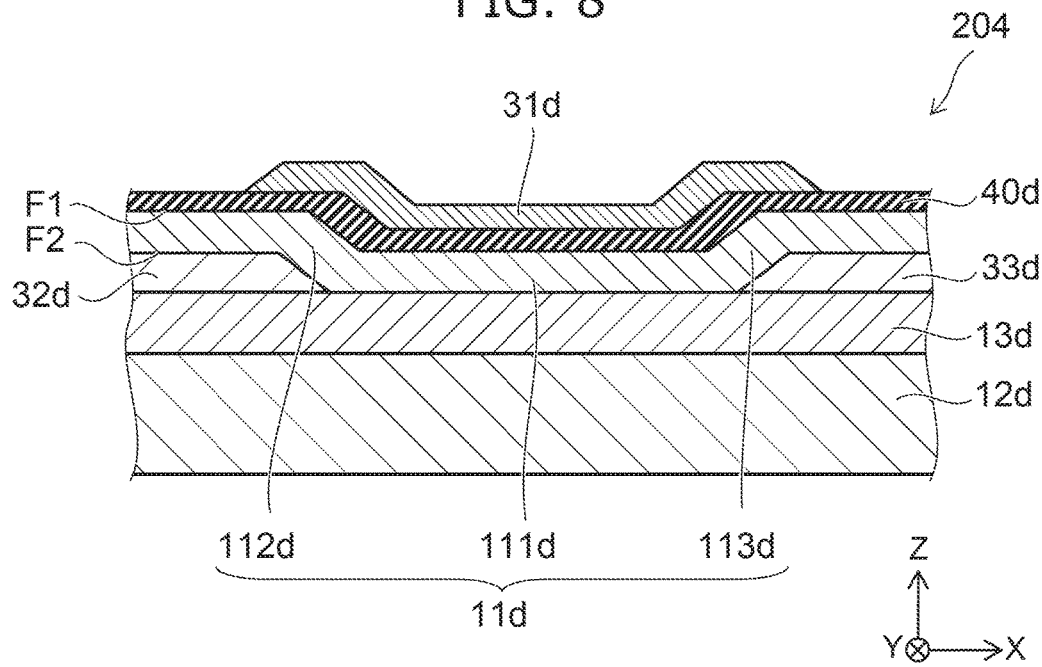
FIG. 9 is a schematic cross-sectional view illustrating a semiconductor device according to the third embodiment.

FIG. 9 is a schematic cross-sectional view illustrating a semiconductor device according to the third embodiment.

As illustrated in FIG. 9, a semiconductor device 204 according to the embodiment includes a first semiconductor layer 11d, a second semiconductor layer 12d, an insulating layer 13d, a first conductive portion 31d, a second conductive portion 32d, a third conductive portion 33d, and a first insulating layer 40d.

The second semiconductor layer 12d, the insulating layer 13d, the first semiconductor layer 11d, the first insulating layer 40d, and the first conductive portion 31d are stacked in this order in the Z-axis direction (the direction from the first conductive portion 31d toward the first semiconductor layer 11d).

A substrate including silicon, for example, is used for the second semiconductor layer 12d. Silicon oxide, for example, is used for the material of the insulating layer 13d. The insulating layer 13d is, for example, a buried oxide (BOX) layer.

The first semiconductor layer 11d is separated from the first conductive portion 31d in the Z-axis direction. In this example, the first semiconductor layer 11d includes the oxide semiconductor 100 according to the first embodiment. The same descriptions given for the semiconductor device 11 according to the first embodiment may be applied to the material and configuration of the first semiconductor layer 11d.

However, the first semiconductor layer 11d may be formed of the same material and have the same stacked structure as the first semiconductor layers 11a, 11b, and 11c described in the second embodiment. Specifically, for example, the first semiconductor layer 11d may include a first region that includes an oxide including In, Ga, and Si, and a second region that includes an oxide including at least one of In, Ga, and Zn; and the first region and the second region may be stacked in the Z-axis direction.

The first semiconductor layer 11d includes first to third portions 111d to 113d. The second portion 112b is separated from the third portion 113d in the X-axis direction. The first portion 111d is positioned between the second portion 112d and the third portion 113d.

The second conductive layer 32d is electrically connected to the second portion 112d. The third conductive portion 33d is electrically connected to the third portion 113d. The first insulating layer 40d is provided between the first semiconductor layer 11d and the first conductive portion 31d. The same materials are used for the first to third conductive portions 31d to 33d and the first insulating layer 40d as are used for the first to third conductive portions 31 to 33 and the first insulating layer 40 of the first embodiment.

The semiconductor device 204 illustrated in FIG. 9 is a thin film transistor with a so-called top gate/bottom contact structure. Specifically, the second conductive portion 32d and the third conductive portion 33d are in contact with the first semiconductor layer 11d at a lower face (a second face F2) of the first semiconductor layer 11d. The first insulating layer 40d is in contact with the first semiconductor layer 11d at an upper face (a first face F1 separated from the second face F2 in the Z-axis direction) of the first semiconductor layer 11d.

In the semiconductor device 204 described above, the first semiconductor layer 11d has the same configuration and material as the first semiconductor layer 11 or the first semiconductor layers 11a to 11d. As such, even in the semiconductor device 204, hydrogen sintering resistance is improved and stable characteristics can be obtained. Additionally, the mobility of the carrier can be improved.

Fourth Embodiment

Figure 10:
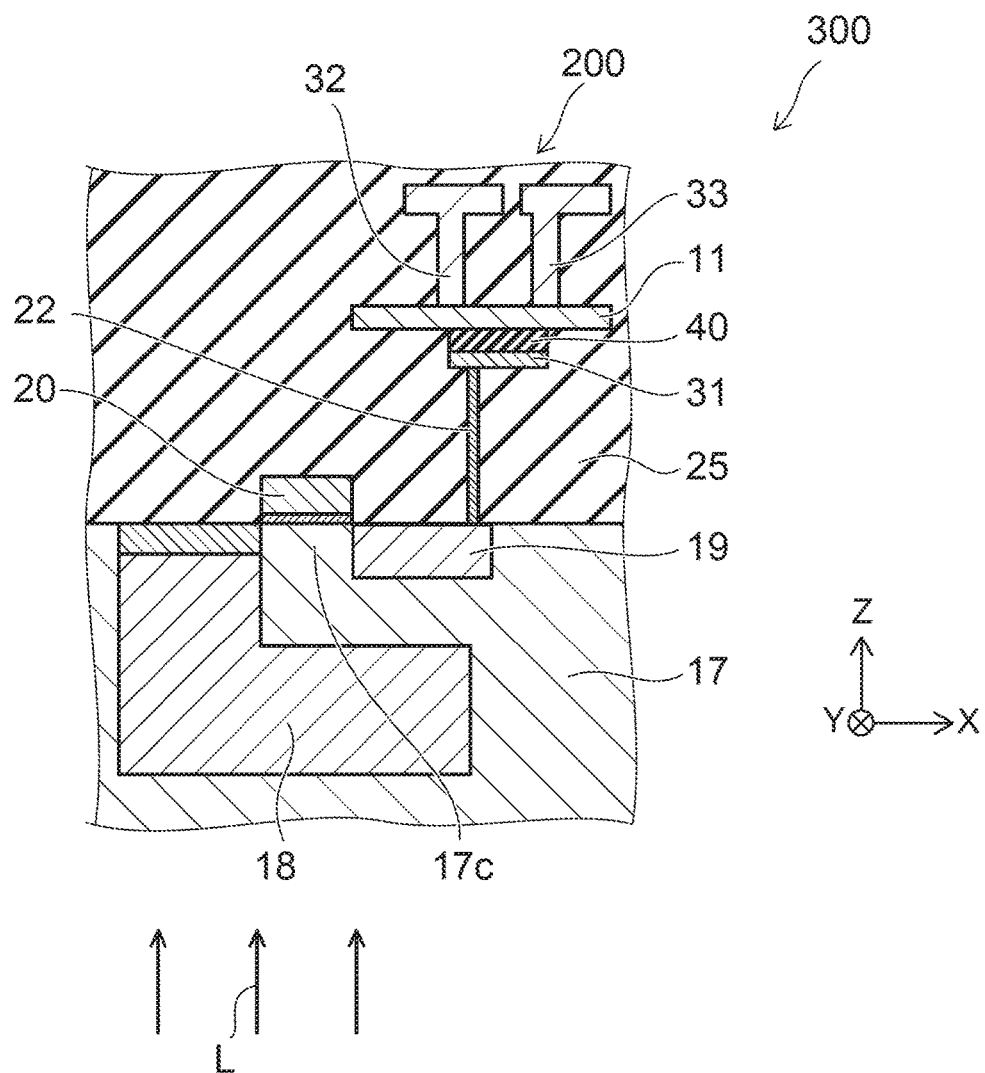
FIG. 10 is schematic cross-sectional view illustrating an imaging device according to a fourth embodiment.

FIG. 10 is schematic cross-sectional view illustrating an imaging device according to a fourth embodiment.

An imaging device 300 according to the embodiment includes at least one of the semiconductor devices of the first to third embodiments. The imaging device 300 is, for example, a back-side illumination CMOS image sensor formed via a CMOS process on a silicon substrate.

In this example, the imaging device 300 includes a substrate 17, an electrode 20, an insulating film 21, an interconnect 22, and the semiconductor device 200. The imaging device 300 may include any one of the semiconductor devices 201 to 204.

The substrate 17 is, for example, a silicon substrate. The substrate 17 includes a first portion 18 and a second portion 19. The first portion 18 is a first conductivity type (e.g. n-type), and is surrounded by a region of a second conductivity type (e.g. p-type). The second portion 19 is separated from the first portion 18 and is of the first conductivity type. A portion (region 17c) of the substrate 17 positioned between the first portion 18 and the second portion 19 is, for example, of the second conductivity type. Note that As and P may be used as n-type impurities, and B may be used as p-type impurities.

The insulation film 21 and the electrode 20 are provided on the substrate 17. The insulating film 21 is provided between the region 17c and the electrode 20, and is in contact with the region 17c and the electrode 20.

The semiconductor device 200 is provided over the substrate 17. An insulating layer 25 (interlayer insulating film) is provided between the substrate 17 and the semiconductor device 200. For example, silicon oxide may be used for the insulating layer 25.

The first conductive portion 31 of the semiconductor device 200 is separated from the substrate 17 in the Z-axis direction. The insulating layer 25 is provided between the substrate 17 and the first conductive portion 31. The interconnect 22 is electrically connected to the second portion 19 of the substrate 17. The interconnect 22 is also electrically connected to the semiconductor device 200. In this example, the interconnect 22 is electrically connected to the first conductive layer 31.

In the imaging device 300 described above, the first portion 18 functions as a photoelectric converter (a photodiode). In the first portion 18, photoelectric conversion occurs due to light L that has entered the substrate 17. The electrode 20 is, for example, a transfer gate. By controlling the potential of the electrode 20, the carrier in the first portion 18 produced by the photoelectric conversion is transferred to the second portion 19.

The second portion 19 is, for example, a floating diffusion. The potential of the second portion 19 changes upon transfer of the carrier to the second portion 19 by the transfer gate. As a result, a signal that corresponds to the light L is input into the semiconductor device 200 via the interconnect 22. In this example, the semiconductor device 200 is used as an amp transistor. The signal is amplified by the semiconductor device 200 and the amplified signal is processed by a peripheral circuit (not illustrated). Note that the semiconductor device 200 needs not be an amp transistor.

A stacked TFT in an interconnect layer formed with an interlayer insulating film interposed therebetween is used for a portion of a circuit fabricated on such a silicon substrate. This enables a high degree of integration and also makes it possible to reduce the size of the chips. Additionally, in the case of the image sensor, compared to a case where the transistor is provided on the substrate surface, due to the fact that the transistor is provided in the interconnect layer, the size of the photodiode on the substrate can be increased.

On the other hand, with the back-side illumination CMOS image sensor, it is preferable that hydrogen sintering be performed at a high temperature of 420° C., after element forming. Thus, pixel defects can be eliminated. However, as described previously, with the semiconductor device of the reference example in which InGaZnO (IGZO) was used, defects occur in transistor operations due to hydrogen sintering.

In contrast, with the imaging device according to the embodiment, the semiconductor devices 200 to 204 with stable characteristics and high sintering resistance are used. Thus, it is possible to perform hydrogen sintering at a high temperature and image quality can be improved.

Fifth Embodiment

Figure 11A:
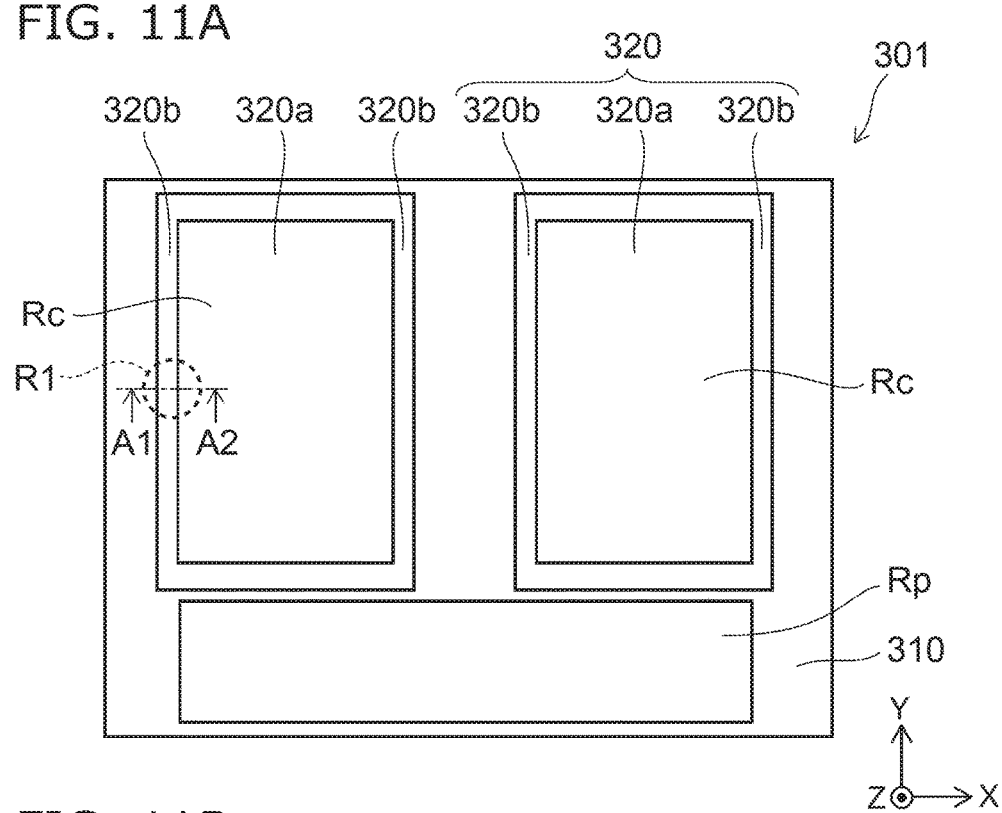
FIGS. 11A and 11B are schematic views illustrating a semiconductor memory device according to a fifth embodiment.
Figure 11B:
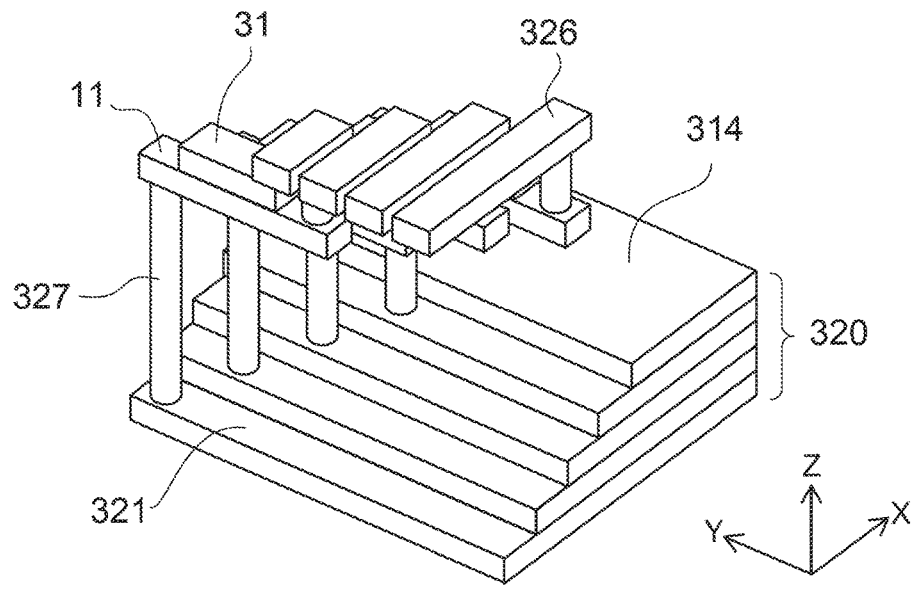
Figure 12:
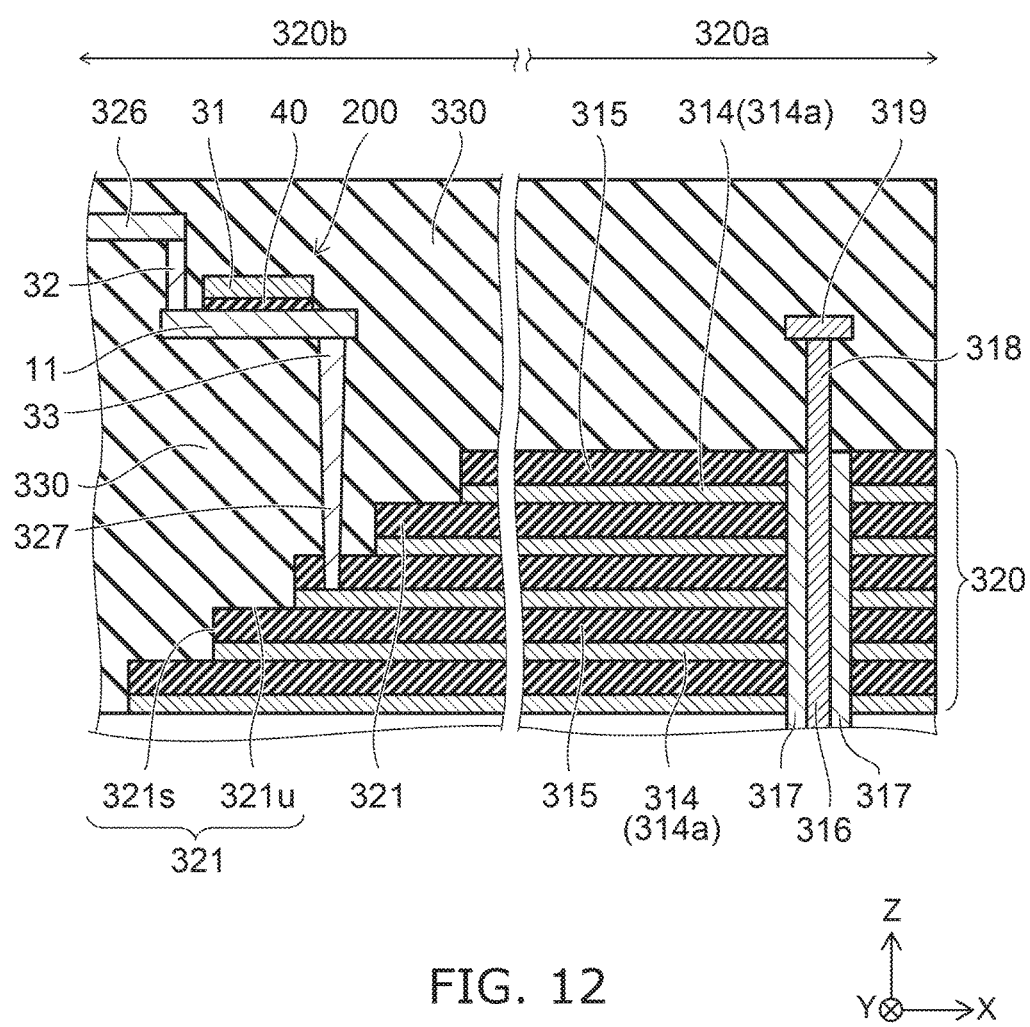
FIG. 12 is a schematic view illustrating a semiconductor memory device according to the fifth embodiment.

FIGS. 11A and 11B and FIG. 12 are schematic views illustrating a semiconductor memory device according to a fifth embodiment.

FIG. 11A is a schematic plan view illustrating a semiconductor memory device 301 according to the embodiment. FIG. 11B is a schematic perspective view in which a region R1 depicted in FIG. 11A is shown enlarged. FIG. 12 is a schematic cross-sectional view in which a cross-section taken along A1-A2 depicted in FIG. 11A is shown enlarged.

As illustrated in FIG. 11A, the semiconductor memory device 301 includes a substrate 310. The substrate 310 is, for example, a silicon substrate. The substrate 310 includes a memory cell region Rc and a peripheral circuit region Rp. A plurality of memory cells is arranged three-dimensionally in the memory cell region Rc. The peripheral circuit region Rp includes a peripheral circuit for driving the memory cells.

The semiconductor memory device 301 includes a stacked body 320, provided on the memory cell region Rc of the substrate 310. As illustrated in FIG. 12, the stacked body 320 includes a plurality of conductive films 314 and a plurality of insulating films 315. The conductive films 314 and the insulating films 315 are stacked along the Z-axis direction on the substrate 310. A unit structural body is constituted by one of the conductive films 314 and one of the insulating films 315. The conductive films 314 are formed, for example, by polysilicon or a similar conductive material, and the insulating films 315 are formed, for example, by silicon oxide or a similar insulative material. The conductive films 314 are separated from each other by a plurality of word lines 314a extending in the X-axis direction.

A silicon pillar 316 extending in the Z-axis direction is provided at a central portion 320a in the X-axis direction of the stacked body 320, and the silicon pillar 316 penetrates the stacked body 320. A memory film 317 is provided around the silicon pillar 316. Thus, a portion of the memory film 317 is disposed between the silicon pillar 316 and the word lines 314a.

The memory film 317 is a film capable of storing an electric charge. For example, in the memory film 317, a tunnel insulating film, a charge storage film, and a block insulating film are stacked in this order from the side of the silicon pillar 316. A bit line 318 extending in the Y-direction is provided on the central portion 320a in the X-axis direction of the stacked body 320. A top end of the silicon pillar 316 is connected to the bit line 318 via a plug 319. A bottom end of the silicon pillar 316 is connected to the substrate 310.

An end portion 320b in the X-axis direction of the stacked body 320 is covered by an insulating layer 330 (an interlayer insulating film). A shape of the end portions 320b is a stepwise shape in which a terrace 321 is formed at each unit structural body constituted of one of the conductive films 314 and one of the insulating films 315.

Note that the terrace 321 is a portion of the end portion in the X-axis direction of the unit structural body. The terrace 321 includes a side face 321s of the unit structural body covered by the insulating layer 330 and a portion of an upper face 321u of the unit structural body covered by the insulating layer 330. Note that the side face is a face that intersects the X-axis direction, and the upper face is a face that intersects the Z-axis direction. One of the terraces 321 includes the side face 321s and the upper face 321u contiguous with the side face 321s. Also, a plurality of the terraces 321 is arranged along the Z-axis direction. In other words, the side face 321s and the upper face 321u are alternately arranged along the Z-axis direction.

The semiconductor memory device 301 includes the semiconductor device 200 provided directly above the end portion 320b (the terrace 321). The semiconductor device 200 is separated from the end portion 320b in the Z-axis direction. The insulating layer 330 is disposed between the end portion 320b and the semiconductor device 200. Note that the semiconductor device 200 may be any of the semiconductor devices 201 to 204 described previously.

The first semiconductor layer 11 of the semiconductor device 200 is separated from the terrace 321 in the Z-axis direction. The insulating layer 330 is provided between the first semiconductor layer 11 and the terrace 321. A contact 327 extending in the Z-axis direction is electrically connected to one of the conductive films 314 (the word lines 314a) at the end portion 320b. The contact 327 is also electrically connected to the semiconductor device 200. In this example, the first semiconductor layer 11 is electrically connected to the conductive film 314 via the contact 327 and the third conductive portion 33. The first semiconductor layer 11 is also electrically connected to an interconnect 326 via the second conductive portion 32. The interconnect 326 is connected to the peripheral circuit.

In such a semiconductor memory device, the semiconductor devices 200 to 204 may be provided in an interconnect layer formed with an interlayer insulating film interposed therebetween. This enables a high degree of integration and also makes it possible to reduce the size of the chips. Note that in the preceding description, an imaging device or a semiconductor memory device has been described by way of example, but the oxide semiconductor and the semiconductor device according to the embodiments may also be used as portions of circuits other than those described above.

It should be noted herein that "electrically connected" is used to mean not only a connection by direct contact, but also a connection via another conductive member or the like.

According to the embodiments, an oxide semiconductor and semiconductor device with stable electrical characteristics can be provided.

In the specification of the application, "perpendicular" refer to not only strictly perpendicular but also include, for example, the fluctuation due to manufacturing processes, etc. It is sufficient to be substantially perpendicular.

Hereinabove, embodiments of the invention are described with reference to specific examples. However, the invention is not limited to these specific examples. For example, one skilled in the art may similarly practice the invention by appropriately selecting specific configurations of components such as the semiconductor layer, the first to third conductive portions, and the first to third regions, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all oxide semiconductors and all semiconductor devices practicable by an appropriate design modification by one skilled in the art based on the oxide semiconductors and the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor layer; and
a gate electrode separated from the semiconductor layer in a first direction,
the semiconductor layer including
a first region including a first oxide including indium, gallium, and silicon, and
a second region including a second oxide including indium,
the first region being provided between the gate electrode and the second region in the first direction,
the first oxide not including zinc, or
the first oxide including zinc and a concentration of silicon in the first oxide being higher than a concentration of zinc in the first oxide, a concentration of zinc in the first oxide being lower than the concentration of zinc in the second oxide,
the second oxide not including silicon, or
the second oxide including zinc and the concentration of zinc in the second oxide being higher than a concentration of silicon in the second oxide,
the concentration of silicon in the first region being not less than 7 atomic percent and not more than 11 atomic percent.

2. The device according to claim 1, wherein
the semiconductor layer further includes a third region including an oxide including indium, gallium, and silicon,
a concentration of silicon in the third region is higher than a concentration of zinc in the third region,
the first region is provided between the third region and the gate electrode in the first direction, and
the second region provided between the first region and the third region in the first direction.

3. The device according to claim 2, wherein a concentration of silicon in the third region is not less than 7 atomic percent and not more than 11 atomic percent.

4. The device according to claim 1, further comprising:
a source electrode; and
a drain electrode,
the semiconductor layer further including
a first portion,
a second portion electrically connected with the source electrode, and
a third portion separated from the second portion in a second direction crossing the first direction, the third portion being electrically connected with the drain electrode,
the first portion being provided between the second portion and the third portion in the second direction,
a direction from the first portion toward the gate electrode is along the first direction.

5. The device according to claim 4, further comprising an insulating layer,
a portion of the insulating layer being provided between the first portion and the gate electrode.

6. A semiconductor device, comprising:
a semiconductor layer; and
a gate electrode separated from the semiconductor layer in a first direction,
the semiconductor layer including
a first region including a first oxide including indium, gallium, and silicon, and
a second region including a second oxide including indium,
the second region being provided between the gate electrode and the first region in the first direction,
the first oxide not including zinc, or
the first oxide including zinc and a concentration of silicon in the first oxide being higher than a concentration of zinc in the first oxide, a concentration of zinc in the first oxide being lower than the concentration of zinc in the second oxide,
the second oxide not including silicon, or
the second oxide including zinc and the concentration of zinc in the second oxide being higher than a concentration of silicon in the second oxide,
the concentration of silicon in the first region being not less than 7 atomic percent and not more than 11 atomic percent.

7. The device according to claim 6, further comprising:
a source electrode; and
a drain electrode,
the semiconductor layer further including
a first portion,
a second portion electrically connected with the source electrode, and
a third portion separated from the second portion in a second direction crossing the first direction, the third portion being electrically connected with the drain electrode,
the first portion being provided between the second portion and the third portion in the second direction,
a direction from the first portion toward the gate electrode is along the first direction.

8. The device according to claim 7, further comprising an insulating layer,
a portion of the insulating layer being provided between the first portion and the gate electrode.

* * * * *